(12) United States Patent
Sentieys et al.

(10) Patent No.: US 9,754,061 B2
(45) Date of Patent: Sep. 5, 2017

(54) METHOD AND DEVICE FOR PROGRAMMING A FPGA

(71) Applicants: UNIVERSITE DE RENNES 1, Rennes (FR); INRIA, Rocquencourt (FR)

(72) Inventors: Olivier Sentieys, Louannec (FR); Sébastien Pillement, Nantes (FR); Christophe Huriaux, Lannion (FR); Antoine Courtay, Plouigneau (FR)

(73) Assignees: UNIVERSITE DE RENNES 1, Rennes (FR); INRIA, Rocquencourt (FR)

( * ) Notice: Subject to any disclaimer, the term of this patent is extended or adjusted under 35 U.S.C. 154(b) by 0 days.

(21) Appl. No.: 15/110,064

(22) PCT Filed: Jan. 8, 2015

(86) PCT No.: PCT/EP2015/050261
§ 371 (c)(1),
(2) Date: Jul. 6, 2016

(87) PCT Pub. No.: WO2015/104335
PCT Pub. Date: Jul. 16, 2015

(65) Prior Publication Data
US 2016/0342722 A1 Nov. 24, 2016

(30) Foreign Application Priority Data

Jan. 9, 2014 (EP) .................................. 14150599
Jan. 31, 2014 (EP) .................................. 14305143

(51) Int. Cl.
*G06F 17/50* (2006.01)
*G06F 15/78* (2006.01)

(52) U.S. Cl.
CPC ...... *G06F 17/5054* (2013.01); *G06F 15/7871* (2013.01); *G06F 17/5045* (2013.01); *G06F 17/5072* (2013.01); *G06F 17/5077* (2013.01)

(58) Field of Classification Search
CPC .................................................. G06F 17/5054
(Continued)

(56) References Cited

U.S. PATENT DOCUMENTS 5,946,219 A 8/1999 Mason et al.
6,128,770 A * 10/2000 Agrawal ............ H03K 19/1737
326/37
(Continued)

FOREIGN PATENT DOCUMENTS

EP    1 303 913 A2    4/2003

OTHER PUBLICATIONS

G. Ochoa-Ruiz et al., "A Novel Approach for Accelerating Bitstream Relocation in Many-Core Partially Reconfigurable Applications," 2013 IEEE International Conference on Control, Decision and Information Technologies, May 6, 2013, pp. 271-276, XP032534862.
(Continued)

*Primary Examiner* — Suresh Memula
(74) *Attorney, Agent, or Firm* — Baker & Hostetler LLP

(57) ABSTRACT

A method of programming a FPGA, wherein the FPGA comprises an array of macrocells, each comprising at least a configurable hardware block and a configurable interconnection network, the method comprises the steps of: providing a high-level configuration file containing: first data defining a set of macrocells and their relative positions; second data defining a configuration of the hardware blocks of the macrocells; and third data defining interconnections between the macrocells; wherein said high-level configuration file contains neither data defining an absolute position (Continued)

of the macrocells within the FPGA, nor local routing information fully defining a configuration of their interconnection networks; converting said high-level configuration file into a bitstream file; and uploading the bitstream file into the FPGA. A semiconductor chip comprising a FPGA and a device configured for programming the FPGA are provided.

15 Claims, 8 Drawing Sheets

(58) Field of Classification Search
USPC .......................................................... 716/117
See application file for complete search history.

(56) References Cited

U.S. PATENT DOCUMENTS

| | | | |
|---|---|---|---|
| 6,311,316 B1* | 10/2001 | Huggins | G06F 17/5045 326/37 |
| 6,507,943 B1 | 1/2003 | Kelem | |
| 6,650,142 B1* | 11/2003 | Agrawal | H03K 19/17728 326/39 |
| 6,678,646 B1 | 1/2004 | McConnell et al. | |
| 8,595,670 B1* | 11/2013 | Tse | G06F 17/5027 716/100 |
| 2003/0101307 A1* | 5/2003 | Gemelli | G06F 17/5045 710/305 |
| 2007/0283311 A1* | 12/2007 | Karoubalis | G06F 17/5054 326/38 |

OTHER PUBLICATIONS

G. Wigley et al., "ReConfigME: A Detailed Implementation of an Operating System for Reconfigurable Computing," IEEE Proceedings of the 20th International Parallel and Distributed Processing Symposium, Apr. 25, 2006, pp. 1-8, XP010920425.
T. Becker et al., "Enhancing Relocatability of Partial Bitstreams for Run-Time Reconfiguration," 2007 15th Annual IEEE International Symposium on Field-Programmable Custom Computing Machines, Apr. 1, 2007, pp. 35-44, XP031131436.
F. Lemonnier et al., "Towards Future Adaptive Multiprocessor Systems-on-Chip: An Innovative Approach for Flexible Architectures," 2012 IEEE International Conference on Embedded Computer Systems, Jul. 16, 2012, pp. 228-235, XP032300774.
C. Huriaux, "Etude et conception d'une architecture de flux de reconfiguration pour FPGA embarqué reconfigurable dynamiquement," Dec. 31, 2012, XP055177060. <http://people.irisa.fr/Christophe.Huriaux/static/huriaux-master-thesis.pdf>.
H. Kalte et al. "REPLICA: A Bitstream Manipulation Filter for Module Relocation in Partial Reconfigurable Systems," Proceedings of the 19th IEEE International Symposium on Parallel and Distributed Processing, 2005.
H. Kalte et al., "REPLICA2Pro: Task Relocation by Bitstream Manipulation in Virtex-II/Pro FPGAs," Proceedings of the 3rd conference on Computing Frontiers, ACM, 2006, pp. 403-412.
E. Horta et al., "PARBIT: A Tool to Transform Biffiles to Implement Partial Reconfiguration of Field Programmable gate Arrays (FPGAs)," Department of Computer Science, Washington University, Saint Louis, MO, Tech. Rep. WUCS-01-13 (2001).
A. Dandalis et al., "Configuration Compression for FPGA-based Embedded Systems," Proceedings of the 2001 ACM/SIGDA ninth international symposium on Field programmable gate arrays, ACM, 2001.
K. Bazargan et al., "Fast Template Placement for Reconfigurable Computing Systems," Department of Electrical Computer Engineering, vol. 17, No. 1, pp. 68-83, 1999.
G. Steiger et al., "Heuristics for Online Scheduling Real-Time Tasks to Partially Reconfigurable Devices," FPL 2003, vol. 2778, No. 56, pp. 575-584.
J. Tabero et al., "A vertex-list approach to 2D HW multitasking management in RTR FPAGs," DCIS, 2003, pp. 545-550.
J. Tabero et al., "Task Placement Heuristic Based on 3D-Adjacency and Look-Ahead in Reconfigurable Systems," ASP-DAC, 2006 IEEE, pp. 396-401.
Hu et al. "A Novel Approach for Finding Candidate Locations for Online FPGA Placement," 2010 10th IEEE International Conference on Computer and Information Technology (CIT 2010), pp. 2509-2515.

* cited by examiner

METHOD AND DEVICE FOR PROGRAMMING A FPGA

CROSS-REFERENCE TO RELATED APPLICATIONS

This application is a National Stage of International patent application PCT/EP2015/050261, filed on Jan. 8, 2015, which claims priority to foreign European patent application No. EP 14150599.0, filed on Jan. 9, 2014 and European patent application No. EP 14305143.1, filed Jan. 31, 2014, the disclosures of which are incorporated by reference in their entirety.

FIELD OF THE INVENTION

The invention relates to a method of programming a programmable logic device of the FPGA (Field-Programmable Gate Array) family, to a device for carrying out such a method and to a semiconductor chip integrating such a device and a FPGA.

The invention applies in particular to the partial reconfiguration, and even more particularly to dynamically reconfiguration, of FPGAs.

BACKGROUND

Among the existing reconfigurable hardware technologies, Field Programmable Gate Arrays (FPGAs) are a breakthrough in terms of performances and flexibility. They constitute a tradeoff between ultra-flexible but inefficient processors and powerful but fixed-functions Application Specific Integrated Circuits (ASICs). Moreover, reconfigurable hardware is one of the leading choices when one wants to implement a given function in hardware, because of the prototyping costs induced by an ASIC: millions dollars for the masks, the associated tools and the engineering team.

FPGAs can be seen as a "sea" of logic elements glued together by a dense routing network assuring the data links. Because of the overhead needed by fully programmable logic elements to undertake the implementation of a complex function, FPGA manufacturers often add dedicated "black boxes" in the circuit. These cells allow performing more efficiently specific tasks such as arithmetic calculations (multiplications, additions, etc.) signal processing or interfacing the chip with incoming and outgoing signals.

Logic elements, as well as complex cells and routing network, can be electrically programmed thanks to memory cells tied to each transistor realizing a connection on the logic fabric. Although they are evenly positioned on the circuit, all of these memory cells can be seen as a single memory layer. This configuration memory is intended to receive a bitstream, the set of each bit determining the state of every configurable element of the FPGA.

FIG. 1A is a simplified view of the logic fabric of an "island-style" FPGA, indicated as a whole by reference PLC, comprising an array of logic blocks LB surrounded by an interconnection network ICN, the latter being constituted by interconnecting wires IW and four-way configurable switches SW (replaced by three-way switches on the edges of the FPGA). Interconnecting wires IW, crossing the circuit from edge to edge, are grouped in "X" (horizontal) and "Y" (vertical) channels comprising W≥1 (and preferably W>1) wires each, which cross forming a square-mesh network.

Each line (resp. column) of the logic fabric comprises alternatively X (resp. Y) routing channels and logic blocks LB. A given routing channel is made of multiple subsequent segments (one horizontal segment is shown in bold on FIG. 1A) and each segment runs from one configurable switch to another.

A switch SW is disposed at each crossing of two wires; a group of "W" switches disposed at the crossing of two W-wire channels form a "switchbox" SWB (in some embodiment, switchboxes could provide only part of the possible connections between wires). Each four-way switch comprises six independent transistors, while only three transistors are required to implement a three-way switch. W switches at the intersection of an "X" and a "Y" channel form a "switchbox". Additional switches—not represented on the figure—ensure the connections between input/output ports of the logic blocks LB and the interconnecting wires IW.

Although this does not appear on FIG. 1A, a fully reconfigurable interconnection network can account for up to 90% of the FPGA surface, compared to 10% for the logic blocks.

FIG. 1B illustrates a possible implementation of a reconfigurable logic block LB, which is a particular case of reconfigurable hardware block used in FPGA.

The logic block LB of FIG. 1B has four input ports IN and one output port OUT, each port being 1-bit wide. A four-input look-up table 4-LUT allows implementing any combinatorial logic function of the four input bits. The input port of a D-type flip-flop DFF is connected to the output port of the look-up table. A multiplexer MUX, driven by a command signal SEL, is used to provide, at the output port of the logic block, either the output signal of the flip-flop or that of the look-out table. CK is the clock signal of the flip-flop.

A simple FPGA may only comprise interconnection networks and logic blocks of the kind illustrated on FIG. 1B, and possibly dedicated input/output blocks on the edges of the logic fabric. However, more complex devices may also comprise different kinds of reconfigurable hardware blocks such as memories and arithmetic units. These blocks might be implemented by suitably interconnected logic blocks of the kind of FIG. 1B, but this would be rather inefficient.

A so-called "bitstream" file, stored in the FPGA configuration memory (which is usually a static RAM, or SRAM), contains all the data required to fully configure the interconnection network and the hardware blocks of the FPGA. In the simplified case of an island-style FPGA (FIG. 1A), wherein all the hardware blocks are logic blocks of the kind illustrated on FIG. 1 B, this comprises the status of all the transistors implementing all the switches of the interconnection network, the 16 bits defining the content of each 4-input 1-output look-up table 4-LUT and the value of the "SEL" bit for each logic block. In reality, raw data are often compressed to reduce the time required to load the bitstream file on the FPGA and the size of the external memory storing the bitstream before its loading into the configuration memory. [Dandalis2001] describes a format- and architecture-independent method of compressing raw bitstreams; U.S. Pat. No. 6,507,943 describes a less general bitstream compression method, based on particular hardware features of the target FPGA.

Several approaches can be used to insert the bitstream file into the FPGA:

Serial insertion, where the configuration bits are inserted one after the other;

Word-parallel insertion, which is still a serial insertion but with N>1 bits inserted at a time;

Word-addressing, where the configuration memory is addressed like a RAM;

Hybrid, wherein part of the bitstream data is first serially inserted into a shift-register memory, and then loaded into specific bits of the configuration memory.

Bistream files are generated by CAD tools and have proprietary formats, which are defined by the FPGA manufacturers and are not publicly released. Very little information is available regarding these formats, which makes almost impossible to retrieve useful data from a bitstream file in order to interoperate with other CAD tools.

In some applications it is necessary to perform partial reconfiguration of a FPGA, i.e. to reconfigure only a portion of its logic fabric while maintaining the rest of it unchanged.

Document EP 1 303 913 describes a FPGA architecture allowing partial reconfiguration.

Document U.S. Pat. No. 5,946,219 describe a method of performing partial reconfiguration of a FPGA comprising generating a "partial bitstream" describing only the logic blocks and interconnection which have to be modified. The partial bitstream is generated starting from a full bitstream defining the FPGA initial configuration. This method is mostly suitable for small, local changes of the configuration. It does not allow loading several fully independent bitstreams on a same reconfigurable device.

A particular application of partial reconfiguration, and a very demanding one, is reconfigurable computing, wherein some hardware modules (or "tasks") of a FPGA or another programmable logic device are reconfigured while others keep working (dynamical reconfiguration). Reconfigurable computing requires, inter alia, determining at runtime the position of a particular, predefined hardware task within the logical fabric of the FPGA. This is a difficult problem: indeed, since the bitstream format is unknown, it is not always possible to "relocate" a task by directly altering its partial bitstream. Instead it is necessary:

either to use a CAD tool to generate, on request, a new partial bitstream for a specific location of the hardware task;

or to store in an external module a plurality of partial bitstreams for each hardware task, one for each possible location of the task (see e.g. U.S. Pat. No. 6,678,646).

The first option introduces unacceptable delays, in particular for reconfigurable computing; the second one can lead to very high memory consumption.

Some tools have been developed to allow hardware task relocation by manipulating the associated partial bitstream. They are e.g. "REPLICA" (see [Kalte 2005]), REPLICA 2 PRO (see [Kalte 2006]) and PARBIT (see [Horta 2001]). They act as filters to allow a single source bitstream to be placed at various Partially Reconfigurable Regions (PRR) of the FPGA. However, these tools are limited to a particular FPGA architecture, namely the "Virtex" family of Xlinx. Moreover, relocation is only performed in one dimension, as each PRR occupies an entire column of the logic fabric. Even more importantly, this approach is no longer applicable to modern FPGA, wherein address in the bitstreams are encoded using the AES algorithm.

SUMMARY OF THE INVENTION

The invention aims at overcoming the above-mentioned drawbacks of the prior art. More particularly, the invention aims at providing tools for performing hardware task relocation suitable to be applied to any FPGA application. Advantageously, tools according to the present invention are fast (to be compatible with runtime reconfiguration) and memory efficient.

The invention is based on the use of a high-level configuration file, called "virtual bitstream" (VBS) which can be considered an unfinalized, pre-routed bitstream suitable to be loaded almost anywhere on a target FPGA logic fabric. Unlike a "real" bitstream, the VBS is not tied to a specific location on the circuit, hence its "virtual" qualifier. The goal is to generate a single VBS only once, independently from the location of the corresponding hardware task on the logic fabric. Hence, the time-consuming packing, place and route steps are done offline and only location-dependent local routing is performed at runtime in order to ensure fast decoding and low memory overhead. Since each task is described in a position-independent manner by a VBS, moving it from one position to another in the target logic fabric becomes a simple operation compared to the state-of-the-art case where each possible position of a task needs a specific bitstream.

An object of the present invention is a method of programming a FPGA according to claim 1, wherein said FPGA comprises an array of macrocells, each comprising at least a configurable hardware block and a configurable interconnection network, the method being characterized in that it comprises the steps of:

a) providing a high-level configuration file (called "virtual bitstream") containing:

first data defining a set of macrocells and their relative positions;

second data defining a configuration of the hardware blocks of said macrocells; and third data defining interconnections between said macrocells;

wherein said high-level configuration file contains neither data defining an absolute position of said macrocells within the FPGA, nor local routing information fully defining a configuration of their interconnection networks;

b) converting said high-level configuration file into a bitstream file; and c) uploading said bitstream file into the FPGA.

The configurable hardware blocks of the FPGA can be logic blocks as described above. More generally, they can be any kind of configurable element such as, e.g. memories, processor cores, configurable arithmetic units, etc.

Another object of the present invention is a device according to claim 11, configured for carrying out such a method and comprising:

at least one de-virtualizing module, configured for converting a said high-level configuration file into a bitstream file whose format depends on the architecture of a target FPGA; and at least one logic mapping module, configured for uploading a said bitstream file at a predetermined location of a configuration memory of said target FPGA.

Yet another object of the invention is a semiconductor chip according to claim 15, comprising a FPGA and such a device, said device being configured for programming said FPGA.

Particular embodiments of the invention constitute the subject-matter of the dependent claims.

BRIEF DESCRIPTION OF THE DRAWINGS

Additional features and advantages of the present invention will become apparent from the subsequent description, taken in conjunction with the accompanying drawings, wherein.

DETAILED DESCRIPTION

Although the invention will be described by considering the specific example of a simple island-style architecture (FIGS. 1A and 1B discussed above) it should be stressed that it can be easily adapted to any possible FPGA architecture, e.g. hierarchic, coarse-grain and row-based architectures.

Figure 1A:
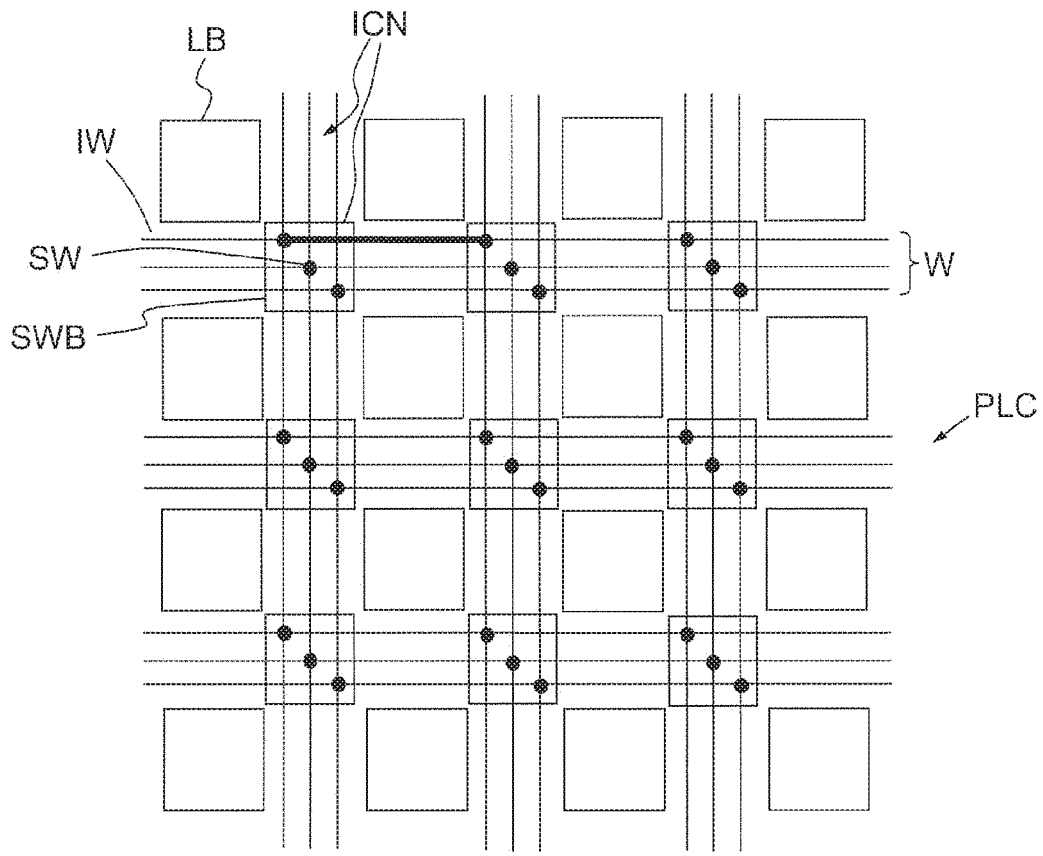
FIG. 1A is a simplified view of the logic fabric of an "island-style" FPGA.
Figure 2A:
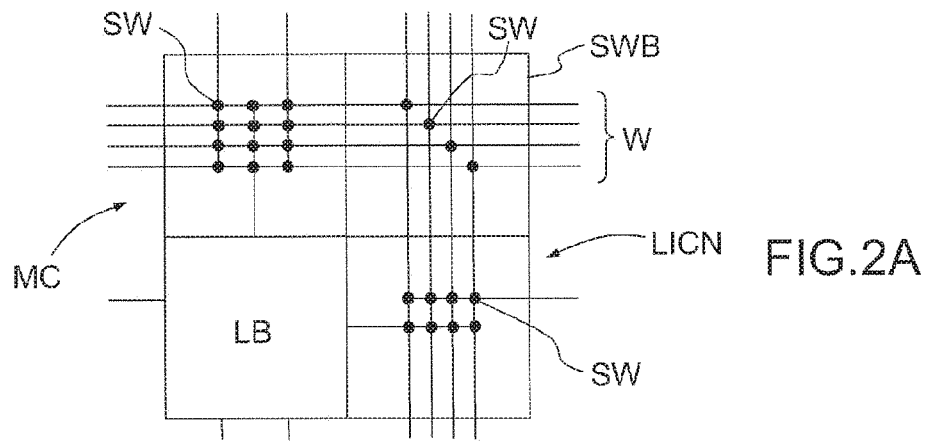
FIG. 2A represents the structure of a macrocell, FIG. 2B the local routing of its interconnection network alone and FIG. 2C said interconnection network considered at a higher abstraction level.

In order to illustrate the VBS concept, it is necessary to introduce, starting from the general architecture of FIG. 1A, the notion of "macrocell". As illustrated on FIG. 2A, a macrocell MC is constituted by a logic block LB (more generally, a reconfigurable hardware block), and a "local" configurable interconnection network LICN comprising a portion of an X-channel and of an Y-channel adjacent to said logic block, the switches connecting said portions of X- and Y-channels to said logic block LB and to adjacent logic blocks, and the switchbox SWB interconnecting said portions of X- and Y-channel. It is easy to check that the whole logic fabric of FIG. 1A is obtained by repeating the macrocell of FIG. 2A horizontally and vertically, and more specifically that the "whole" interconnection networks ICN is obtained by repeating the "local" interconnection network LICN of the macrocells.

Figure 2B:
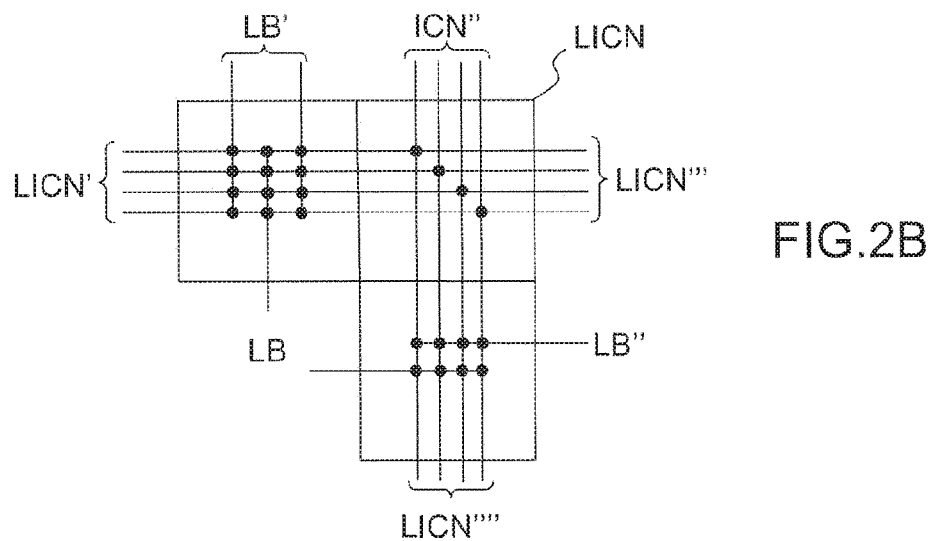

FIG. 2B only represents the interconnection network part of a macrocell. It shows that this local interconnection network LICN has a plurality of "ports" which are connected to the logic block LB, to logic blocks LB', LB" of adjacent macrocells or to local interconnection networks LICN', LICN", LICN''', LICN'''' of adjacent macrocells. For macrocells disposed at the edges of the logic fabric, some ports may be connected to dedicated input/output blocks.

Figure 2C:
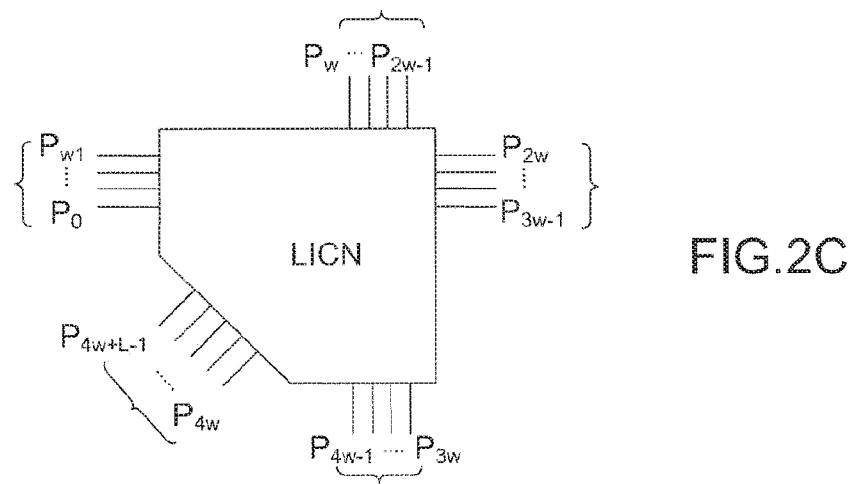

FIG. 2C shows a more abstract view of the interconnection network LICN of the macrocell, hiding its internal structure; the network appears as a "black box" with (4W+L) ports labeled $P_0$-$P_{4W+L-1}$, where W is the width of the X- and Y-channels and L the number of input/output ports of each logic block (L=k+1 for a logic block with k inputs and 1 output). Switches SW are ignored at this level of abstraction; the configuration of the local interconnection network LICN is only defined by indicating the connection between its ports (e.g. by indicating that port $P_3$ is connected to port $P_5$ and port $P_5$ to ports $P_7$ and $P_{12}$). This abstraction is instrumental in making the VBS independent from local routing, and allows a reduction of the data required to describe the macrocell configuration.

Figure 1B:
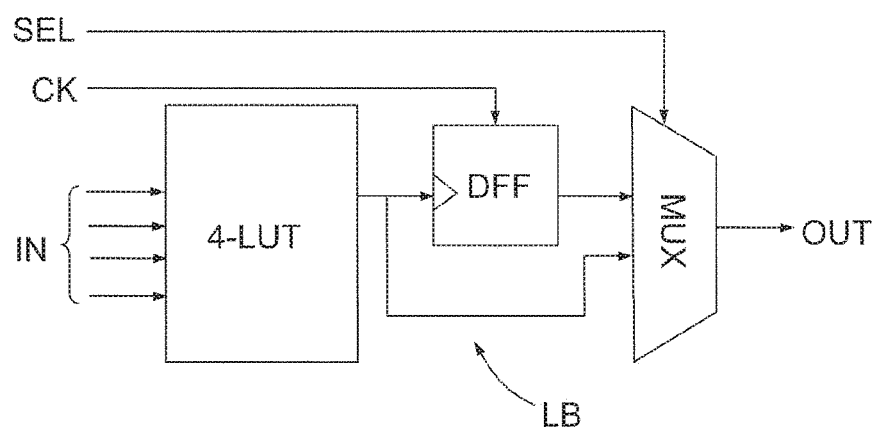
FIG. 1B illustrates a possible implementation of a reconfigurable logic block.

The raw number Nrawof bits required to fully configure a macrocell MC of a FPGA having the architecture of FIGS. 1A, 1B with k input LUTs and W routing channels is given by:

$$Nraw = N_{LUT} + N_{LB} + 6 \times [N_S + N_{C+}] + 3 \times [N_{CT}]$$

where:

$N_{LUT}$ is the LUT content, $N_{LUT}=2^k$;

$N_{LB}$ is the value of the SEL command, $N_{LB}=1$;

$N_S$ is the number of configurable switches in a switch box, $N_S=W$;

$N_{C+}$ is the number of 4-way configurable switches per channel, $N_C=(k+1)\cdot(W-1)$, and $N_{CT}$ is the number of 3-way configurable switches per channel, $N_{CT}=(k+1)$. Table 1 summarizes the raw data size $N_{raw}$ for different architectures whose LUT-size ranges from k=3 to k=9 and channel width ranges from W=2 to W=10.

TABLE 1

| W = | k = 3 | 4 | 5 | 6 | 7 | 8 | 9 |
|---|---|---|---|---|---|---|---|
| 2 | 58 | 75 | 100 | 141 | 214 | 351 | 616 |
| 3 | 88 | 111 | 142 | 189 | 268 | 411 | 682 |
| 4 | 118 | 147 | 184 | 237 | 322 | 471 | 748 |
| 5 | 148 | 183 | 226 | 285 | 376 | 531 | 814 |
| 6 | 178 | 219 | 268 | 333 | 430 | 591 | 880 |
| 7 | 208 | 255 | 310 | 381 | 484 | 651 | 946 |
| 8 | 238 | 291 | 352 | 429 | 538 | 711 | 1012 |
| 9 | 268 | 327 | 394 | 477 | 592 | 771 | 1078 |
| 10 | 298 | 363 | 436 | 525 | 646 | 831 | 1144 |

While the main goal of the invention is to allow an unfinalized "virtual" bitstream to be placed anywhere on the logic fabric, it is also very useful to reduce the size of the virtual bit stream in order to lower the download time from an external memory. Even with powerful compression schemes, the raw data entropy of an almost empty macrocell (i.e. a macrocell with a low count of routed wires) is still high since the lack of connections of some of the connection blocks is also information.

According to an embodiment of the invention, the macrocell configuration data is modeled as a list of point-to-point wires by specifying a list of entry point and output point in the local routing network for each of these wires. The data size of each list member depends on the number L of inputs and outputs. In the following, it will be considered that L = k +1.

Table 2 is a report of the connection word size $N_{CW}$ for various channel width (W) and LUT size (2k=2L−1) combinations. It is very advantageous to design the architecture as a trade-off between the W and k parameters in order to keep the "bit waste" as low as possible: the parameter combination should be chosen so that the corresponding connection word size is on an upper limit. Table 3 states the percentage of the previously discussed "wasted bits". This percentage is expressed as the remaining (unused) entropy in the final coding of the connection word size. For VBS compression purposes, it is preferred to choose a target word size and then select the better architecture (W,k)—e.g. (4, 3), (6, 7), (7, 3), etc—i.e. that with the lowest "bit waste" percentage, and therefore the highest compression ratio. It is easy to see that, for a 5-bit macrocell connection word size, optimal use of the available entropy is reached for architectures (6,7) and (7,3); on the contrary (3,4) would be a poor choice with more than 18% of the bit wasted.

TABLE 2

| W = | k = 3 | 4 | 5 | 6 | 7 | 8 | 9 |
|---|---|---|---|---|---|---|---|
| 2 | 4 | 4 | 4 | 4 | 4 | 5 | 5 |
| 3 | 4 | 5 | 5 | 5 | 5 | 5 | 5 |
| 4 | 5 | 5 | 5 | 5 | 5 | 5 | 5 |
| 5 | 5 | 5 | 5 | 5 | 5 | 5 | 5 |
| 6 | 5 | 5 | 5 | 5 | 5 | 6 | 6 |
| 7 | 5 | 6 | 6 | 6 | 6 | 6 | 6 |
| 8 | 6 | 6 | 6 | 6 | 6 | 6 | 6 |
| 9 | 6 | 6 | 6 | 6 | 6 | 6 | 6 |
| 10 | 6 | 6 | 6 | 6 | 6 | 6 | 6 |

TABLE 3

| W = | k = 3 | 4 | 5 | 6 | 7 | 8 | 9 |
|---|---|---|---|---|---|---|---|
| 2 | 10.4% | 7.5% | 4.8% | 2.3% | 0.0% | 18.3% | 16.6% |
| 3 | 0.0% | 18.3% | 16.6% | 15.0% | 13.6% | 12.2% | 10.8% |
| 4 | 13.6% | 12.2% | 10.8% | 9.5% | 8.3% | 7.1% | 6.0% |
| 5 | 8.3% | 7.1% | 6.0% | 4.9% | 3.9% | 2.8% | 1.9% |
| 6 | 3.9% | 2.8% | 1.9% | 0.9% | 0.0% | 15.9% | 15.2% |
| 7 | 0.0% | 15.9% | 15.2% | 14.5% | 13.8% | 13.2% | 12.5% |
| 8 | 13.8% | 13.2% | 12.5% | 11.9% | 11.3% | 10.7% | 10.1% |
| 9 | 11.3% | 10.7% | 10.1% | 9.6% | 9.0% | 8.5% | 7.9% |
| 10 | 9.0% | 8.5% | 7.9% | 7.4% | 6.9% | 6.4% | 5.9% |

From a memory occupation point of view, replacing raw data with a connection list is only advantageous if the number $N_{PTP}$ of point-to-point connections within each macrocell is much lower than the theoretical maximum $N_{TH}=(W+k+1)\cdot(W+k)/2$. More precisely, table 4 shows the maximum number $N_{MAX}$ of point-to-point connections leading to a VBS connection list smaller than the raw dataset for a given (W,k) pair:

TABLE 4

| W = | k = 3 | 4 | 5 | 6 | 7 | 8 | 9 |
|---|---|---|---|---|---|---|---|
| 2 | 6 | 7 | 8 | 9 | 10 | 9 | 10 |
| 3 | 10 | 9 | 11 | 12 | 14 | 15 | 17 |
| 4 | 11 | 13 | 15 | 17 | 19 | 21 | 23 |
| 5 | 14 | 16 | 19 | 22 | 24 | 27 | 30 |
| 6 | 17 | 20 | 23 | 26 | 30 | 27 | 30 |
| 7 | 20 | 19 | 23 | 26 | 29 | 32 | 36 |
| 8 | 19 | 22 | 26 | 30 | 34 | 37 | 41 |
| 9 | 21 | 25 | 30 | 34 | 38 | 42 | 47 |
| 10 | 24 | 28 | 33 | 38 | 43 | 47 | 52 |

For example, for W=4, k=4 the maximum value of $N_{PTP}$ for which a connection list is shorter than the corresponding raw data is $N_{MAX}=13$, while the theoretical maximum number of point to point connections is $N_{TH}=210$. However, in practice, the condition $N_{PTP}<N_{MAX}$ is usually satisfied.

A virtual bitstream containing—beside logic block configuration bits—a list of point-to-point connections representing in compact form the configuration of a portion of the FPGA interconnection network may come in different formats. Three of them, of increasing complexity and compactness, will now be described; an unlimited number of different formats falling within the scope of the invention might be devised.

A first possible binary format for a virtual bitstream comprises a raw list of the LUT content of each macro, aside with a list of its local connections. Table 5 summarizes this format: each indent of the fields denotes a repetitive block. The field preceding the block denotes the number of expected repetitions.

The size in bits of each field is fixed for a given architecture; it is given in function of:
- The with w and height h, expressed in number of macrocells, of the portion to be configured of the FPGA logic fabric;
- The number $N_{Logic}$ of bits required to configure a logic block ($N_{Logic}=2^k+1$ in the case of a logic block having the structure illustrated on FIG. 1B);
- The number L of input/output ports of each logic block (L=k+1 in the case of a logic block having the structure illustrated on FIG. 1B).

TABLE 5

| Size (bits) | Fields | | |
|---|---|---|---|
| $\log_2[\max(w,h)]$ | Size X | | |
|  | Size Y | | |
| $\log_2[w \times h]$ | MacroCount | | |
| $\log_2[\max(w,h)]$ | List of macrocells | PosX | |
|  |  | PosY | |
| $N_{Logic}$ |  | Logic data | |
| $\log_2[2W]$ |  | Route Count | |
| $\log_2[4 \times W + L + 1]$ |  | List of connections | input |
|  |  |  | output |

In Table 5:

"Size X" and "Size Y" represent the width and height of the of the portion of the FPGA logic fabric to be configured and take the values "w" and "h" respectively;

MacroCountwxh is the number of macrocells to be configured. The following data are repeated for each macrocell ("List of macrocells"):

"PosX", "PosY" represent the position of a given macrocell within the portion of the FPGA logic fabric to be configured "Logic data" is the raw configuration data of the logic block of the macrocell, RouteCount represents the number $N_{PTP}$ of point-to-point connections between the ports of the (local) interconnection network of the macrocell. For each said connection ("List of connection"), the "In" and "Out" ports are identified.

The EBNF notation of this first virtual bitstream (VBS) format is:
    VBS=<header>, <macrocell-list>
    header=<SizeX>, <SizeY>
    macrocell-list=<MacroCount>, {<macrocell>}
    macrocell=<PosX>, <PosY>, <Logic Data>, <connection-list>
    connection-list=<RouteCount>, {<connection-data>}
    connection-data=<input>, <output>.

A second possible binary format for a virtual bitstream is especially designed to have a higher compression ratio for dense interconnection networks. What is different from the first format is the structure and size of the "List of connections".

A "connection present" bit and its associated "connection data" represent each connection (see Table 6). The ports of the interconnection network are numbered and the connection list sorted by input port number. It is supposed that different connection cannot share a same input ports; this condition can always be satisfied by switching the input and output ports of some connection, which is allowed as the connections are bidirectional. For each possible input, taken in order, of the local interconnect network, the following two exclusive cases may happen:

There is a connection in the list that uses this input:
The connection present bit is set to 1,
The connection data field is set to the corresponding output of the connection.
No connection of the list use this input:
The connection present bit is set to 0,
The connection data field is set to the next used connection input of the list.

For example, let us consider the case where port 1 of the local interconnect network is connected to port 6; ports 2 and 3 are not used and port 4 is connected to port 5, the total number of ports being 6. Then, the list of connections would be the following:

Input port 1
  Connection present flag=1 (meaning that port 1 is the input port of a point-to-point connection),
  Connection data=6 (meaning that port 1 is connected to port 6).
Input port 2
  Connection present flag=2 (meaning that port 2 does not take part to any point-to-point connection),
  Connection data=4 (meaning that the next used input port is n°4; there is no entry corresponding to port 3, which is not used as the input of a connection).
Input port 4:
  Connection present flag=1,
  Connection data=5.
Input port 5
  Connection present flag=0 (port 5 is used as an output port, not an input one, although this distinction is arbitrary),
  Connection data=0 (any other port of the interconnection network is used as an input port).

TABLE 6

| Size (bits) | Fields | | |
|---|---|---|---|
| $\log_2[\max(w,h)]$ | Size X | | |
|  | Size Y | | |
| $\log_2[w \times h]$ | MacroCount | | |
| $\log_2[\max(w,h)]$ | List of macrocells | PosX | |
|  |  | PosY | |
| $N_{Logic}$ |  | Logic data | |
| $\log_2[2W]$ |  | Route Count | |
| 1 |  | List of connections | Connection present flag |
| $\log_2[4 \times W + L + 1]$ |  |  | Connection data |

The EBNF notation of this second virtual bitstream (VBS) format is:
  VBS=<header>, <macrocell-list>
  header=<SizeX>, <SizeY>
  macrocell-list=<MacroCount>, {<macrocell>}
  macrocell=<PosX>, <PosY>, <Logic Data>, <connection-list>
  connection-list=<RouteCount>, {<Connection Present?>, <connection-data>}
  connection-data=(<output>|<input>)

A third possible binary format for a virtual bitstream can be considered an enhanced version of the second one wherein the size of the Virtual Bitstream is further reduced through the use of lists for each X and Y axis of macrocells of the hardware task.

The connection list of each macrocell is coded accordingly to the VBS format version 2. However, instead of providing the macrocell data with their respective positions as a heap, they are ordered in two kinds of lists: Y-lists and X-lists. Multiples X lists are contained in a single Y-list.

Each element of the Y-list can be either:
  A 0 bit, meaning that the current line does not contain any macrocell, or
  A 1 bit, in which case an X list follows.
For each X list, the same pattern is followed:
  A 0 bit indicates the absence of a macrocell at this X position, and
  A 1 bit is followed by macrocell data as in the second format.
This is illustrated on table 7.

TABLE 7

| Size (bits) | Fields | | |
|---|---|---|---|
| $\log_2[\max(w,h)]$ | Size X | | |
|  | Size Y | | |
| $\log_2[w \times h]$ | MacroCount | | |
| 1 | Y list | X-list present? | |
| 1 |  | X list | Macro present? |
| $N_{Logic}$ |  |  | Logic data |
| $\log_2[2W]$ |  |  | Route count |
| 1 |  |  | List of connections | Conf. present flag |
| $\log_2[4 \times W + L + 1]$ |  |  |  | Connection data |

The EBNF notation of this third virtual bitstream (VBS) format is:
  VBS=<header>, <macrocell-list>
  header=<SizeX>, <SizeY>
  macrocell-list=<MacroCount>, {<y-list>};
  y-list="0"|"1", {<x-list>}
  x-list="0"|"1", <macrocell>
  macrocell=<Logic Data>, <connection-list>
  connection-list=<RouteCount>, {<Connection Present?>, <connection-data>}
  connection-data=(<output>|<input>)

Figure 3:
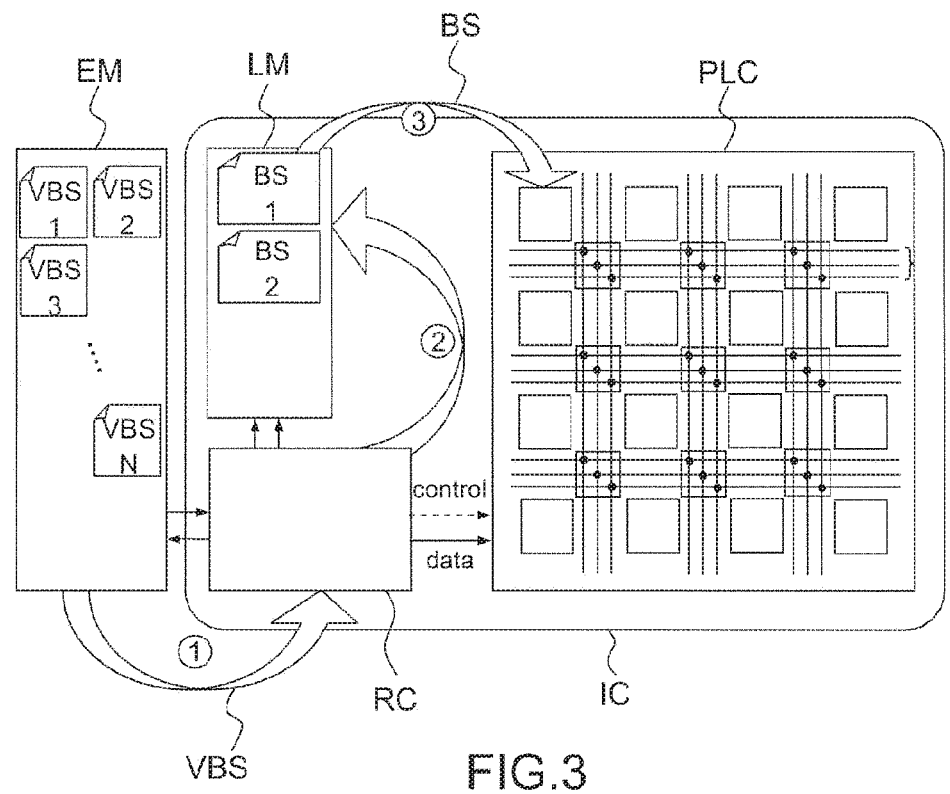
FIG. 3 illustrates a method according to an embodiment of the invention.

FIG. 3 illustrates how, according to an embodiment of the present invention, virtual bitstreams can be used for programming a FPGA. An external memory EM—e.g. a mass storage memory of a computer—stores multiple virtual bitstreams VBS1-VBSN corresponding to different hardware task to be implemented in a FPGA indicated by reference PLC. A device according to an embodiment of the invention, called "reconfiguration controller" and indicated by reference RC loads one or more virtual bitstreams from the external memory EM (step 1), stores them into a local (cache) memory LM (step 2), "de-virtualizes" them—i.e. it decompresses VBS data an re-map the routing information and logic data to the target logic fabric, which results in actual, architecture- and location-dependent bitstreams— and finally loads the resulting bitstream into the configuration memory of the FPGA (step 3). In the exemplary embodiment of FIG. 3, the reconfiguration controller, the local memory and the FPGA are co-integrated on a single semiconductor chip, but this is not essential.

Figure 4:
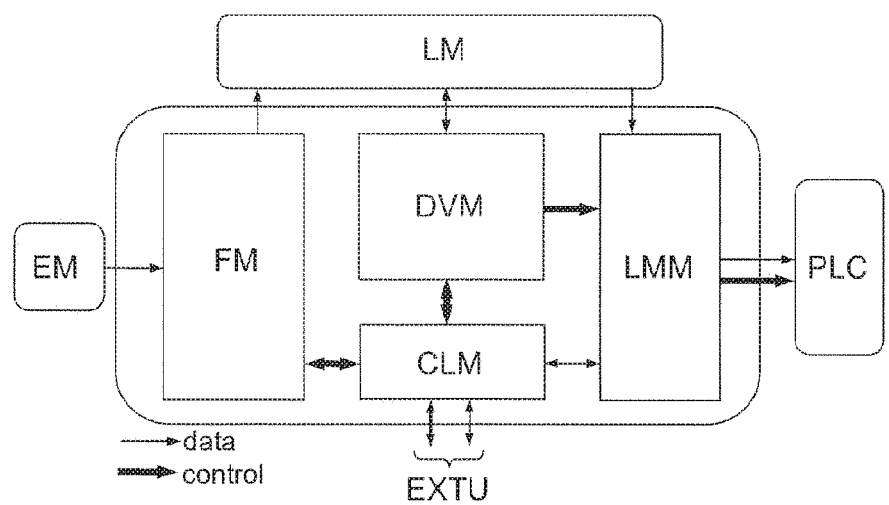
FIG. 4 is a functional scheme of a device according to an embodiment of the invention.

FIG. 4 shows a synoptic of the reconfiguration controller RC. It can be seen that four distinct functional modules may be identified: a core logic module CLM, a fetching module FM, a de-virtualizing module DVM and a logic mapping module LLM. The core logic and fetching modules are largely independent from the FPGA architecture, while the de-virtualizing and the logic mapping module are architecture-dependent.

The core logic module CLM, which can be implemented as a soft processor or a hardware state machine, manages the others modules through the use of control signals in order to synchronize their operation. The core logic module is also in charge of interfacing with an external control unit EXTU (e.g. a suitably-programmed general-purpose computer) which configures and commands the whole configuration controller. The core logic is also in charge of determining whether a task can be charged on the FPGA—and in the affirmative of calculating the location where it will be implemented—and whether a task is already implemented and can therefore be unloaded; it can also carry out a defragmentation of the logic fabric i.e. a displacement of the task to allow a better utilization of the hardware resources of the FPGA. These operations are performed by using known placing algorithm; they require the loading of task metadata stored in the external memory EM and the keeping a list of already-implemented tasks.

The expression "task metadata" refers to all the pieces of information on a VBS other than routing data and configuration bits of the logic blocks, e.g. task size, VBS size, number of macrocells used to implement the task etc.

Placing algorithms suitable to be implemented by the core logic unit are known e.g. from [Bazargan 1999], [Steiger 2003], [Tabero 2003], [Tabero 2006] and [Hu 2010].

Figure 5:
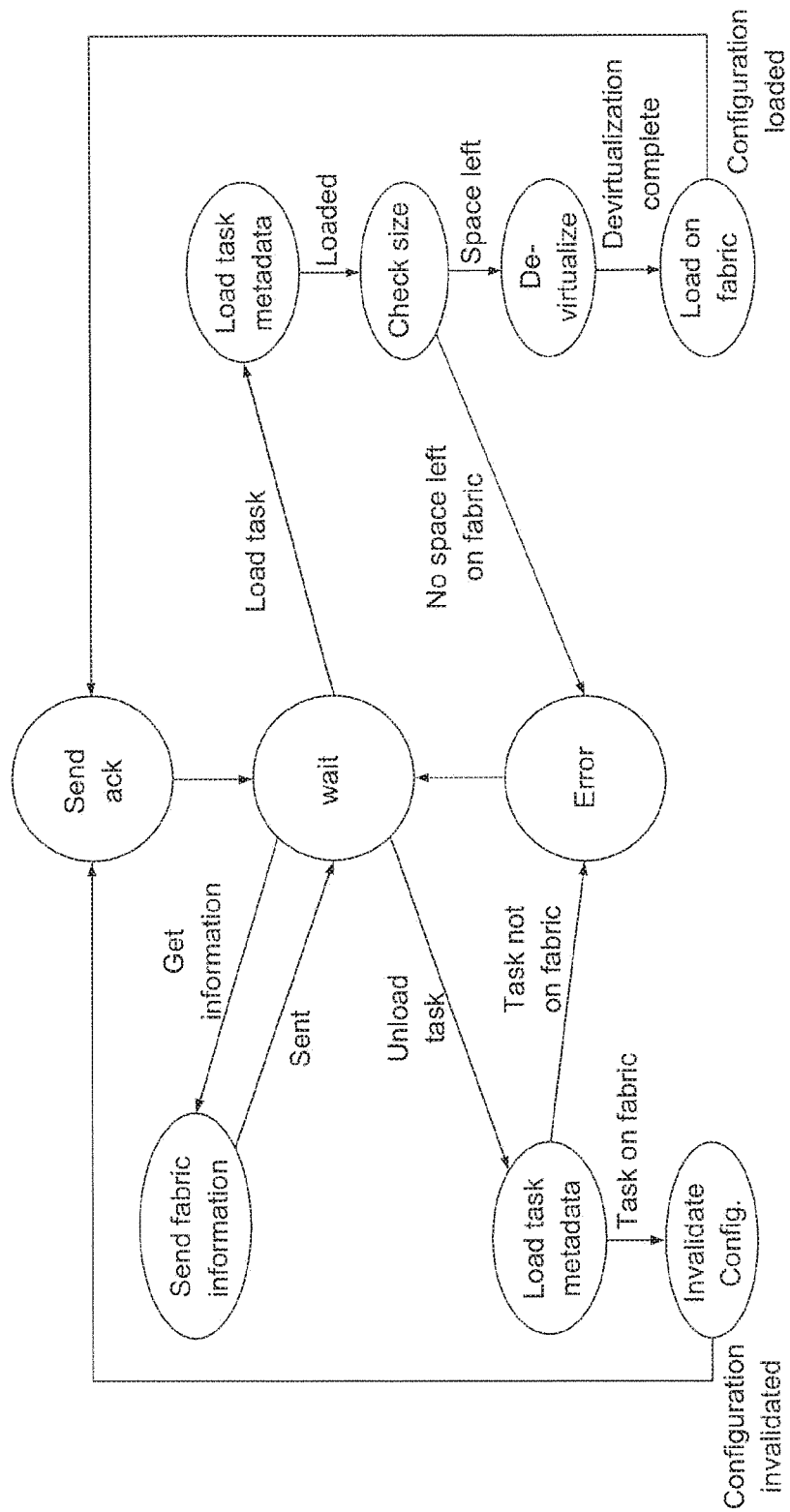
FIG. 5 is a state diagram illustrating the operation of a core logic module of the device of FIG. 4.

FIG. 5 shows the state diagram of a finite state machine (FSM) modeling the core logic module CLM of a reconfiguration controller according to an embodiment of the invention. Different embodiments may use different FSMs, and more particularly simpler ones comprising less states and exchanging less messages with the external control unit EXTU.

The "wait" state waits for messages from the external control unit EXTU: "Load task", "Unload task" and "Get information".

The "Load task" message triggers the loading from external memory EM of task metadata in order to determine if enough space is left on the target FPGA, then it activates the de-virtualizing module to starts the de-virtualization process before activating the logic mapping module for loading the finalized bitstream on the logic fabric (see infra) and sending an acknowledgement ("Send ack") to the external control unit EXTU. If there is no space left on the logic fabric, an error is detected; then the finite state machine returns to its "wait" state.

The "Unload task" message also triggers a load of the specified task's metadata in order to check if a given task is already loaded on the logic fabric. If this is the case, the configuration area corresponding to this task is invalidated by replacing it by an "empty" bitstream and an acknowledgement is sent to the external control unit EXTU ("Send ack"). Otherwise, an error is detected; then the finite state machine returns to its "wait" state.

The (optional) "Get information" message is used to fetch various pieces of information from the controller on the reconfigurable fabric (occupancy, consumption, temperature). These data, e.g. obtained by sensors in the FPGA, can be used by the core logic for task placement.

The fetching module FM is mainly responsible for loading a specific virtual bitstream from the external memory EM to the local memory LM, and for extracting task metadata and providing them to the core logic module.

The de-virtualizing module DVM is in charge of reading the virtual bitstreams from the local memory LM and of saving in the same (or a different) local memory the resulting raw bitstream.

The operation of the de-virtualizing module DVB may be expressed as a de-virtualization algorithm, which maps the connection list of a given macrocell to the configuration bits of a logic fabric macrocell. The actual implementation of the algorithm is strongly dependent on the virtual bitstream format and on the FPGA architecture. However, at high-level, it can be expressed by the following pseudocode:

```
Configuration is array of bits;
for (input, output) in connection_list do
    for route in each_possible_route_between(input, output) do
        if no_conflict_exists(route, Configuration) then
            set_route(route, Configuration)
        end if
    done
done.
```

"Configuration" is the raw bitstream to be generated, which is in the form of an array of bits.

The "connection_list" is a list of point-to-point connection extracted from the virtual bitstream, as explained above. Each connection is characterized by an input port—output port pair.

The first "for" loop goes through this list;

The second "for" loop searches, for each (input, output) pair, all the possible routes of the local configuration network connecting the "input" port to the "output" port. Each route is defined by the status of a number of configurable switches of the macrocell.

Each route which is found is tested for conflicts with already identified ones.

The first route (i.e. switch configuration) which is found to be free from collisions is selected to implement the (input, output) connection.

These operations are repeated for all the point-to-point connections of a given macrocell, and for all the macrocells of the virtual bitstream.

The de-virtualization algorithm is simple and straightforward as the most complex operations are deported at the virtual bitstream elaboration stage. Time consuming operations, like the enumeration of each possible route between a given input and output, can be implemented in a look-up table in the controller, since the result set is finite and fixed in advance for a given architecture.

It should be noted that the de-virtualization algorithm might find itself in a dead end if all the possible routes implementing a given connection collide with other routes. To avoid such a situation, de-virtualization is preferably tested offline for each specific target FPGA architecture. If it turns out that the de-virtualization cannot be carried out successfully, the order of the connections within the virtual bitstream is changed, until de-virtualization becomes possible.

The logic mapping module LMM is in charge of inserting a raw bitstream, read from the local memory, into a specific location (calculated by the core logic module, as discussed above) of the configuration memory of the FPGA. Depending on the target architecture, the logic mapping module may:

Configure a specific serial path in the configuration memory in order to insert bitstream data at the correct location;

Program the targeted location in the configuration memory by direct addressing; or Trigger a memory exchange upon configuration of the hardware task, in the case of a dual configuration memory layout.

It should be understood that the four modules may not be implemented in the form of separate, physically distinguishable units. For example, a single processor or circuit may perform the tasks of two or more said "functional" modules.

Figure 6A:
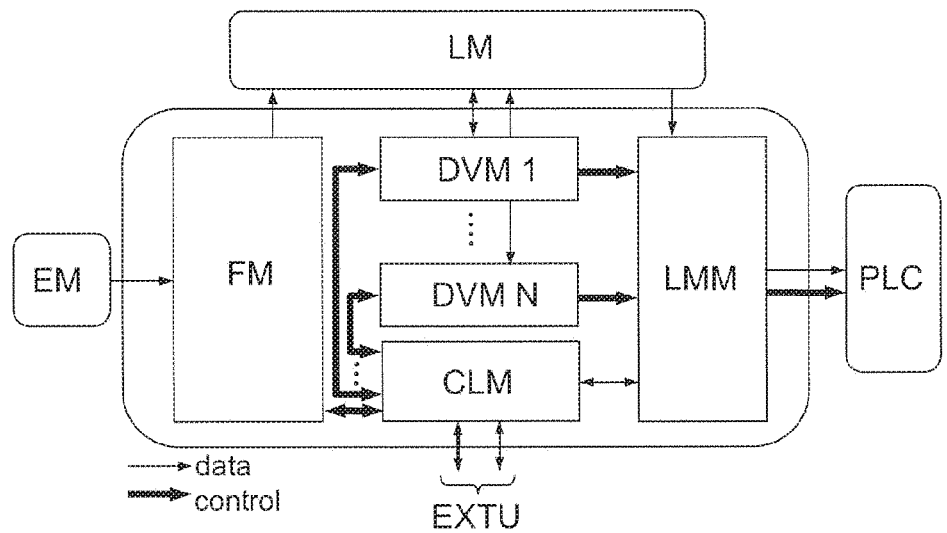
FIGS. 6A and 6B are functional schemes of devices according to particular embodiments of the invention, allowing for parallel processing of one or more high-level configuration files.
Figure 6B:
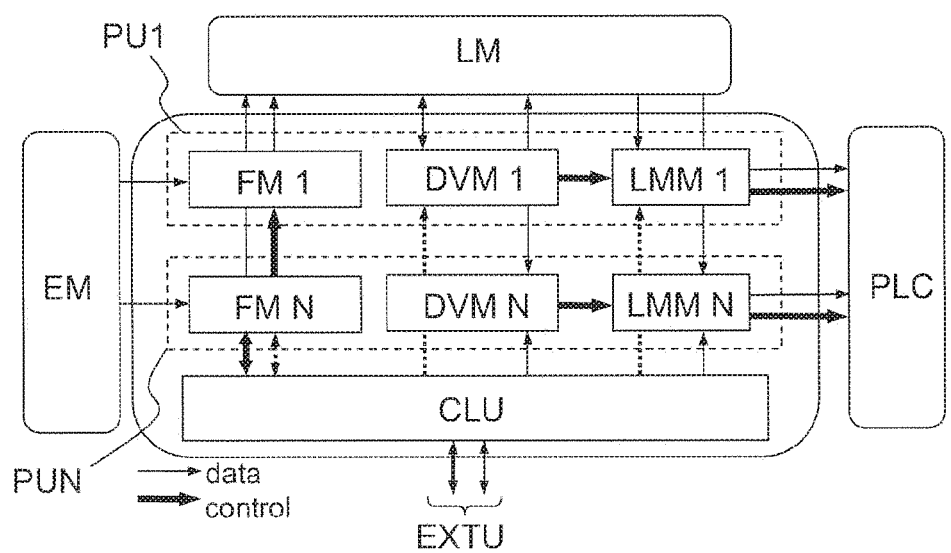

An advantageous feature of the invention is that the reconfiguration controller is intrinsically parallelizable. FIGS. 6A and 6B illustrate two possible parallelized organization of the reconfiguration controller.

FIG. 6A illustrates a reconfiguration controller wherein only the virtual bitstream de-virtualization is parallelized. In such a controller, N>1 de-virtualizing modules DVM 1-DVM N operate in parallel to simultaneously de-virtualize N portions of a same virtual bitstream, corresponding to respective macrocells or groups of macrocells. A tradeoff has to be found between the number N of parallel de-virtualizers and the time taken by the de-virtualization of a single macrocell, so that the fetching module or the logic mapper do not become bottlenecks.

FIG. 6B illustrates a different reconfiguration controller comprising N>1 processing units PU1-PUN, each comprising a fetching module (FM1, . . . , FMN), a de-virtualizing module (DVM1, . . . , DVMN) and a logic mapping module (LMM1, . . . , LMMN) for simultaneously de-virtualizing multiple virtual bitstreams. This requires that the surrounding environment of the reconfiguration controller also supports multiple concurrent access: the external and local memories should have N read/write interfaces and the logic fabric should also be designed to allow multiple bitstreams to be programmed in parallel.

The two parallelization scheme may be combined; in this case, each processing unit PUi will comprise multiple parallel de-virtualizing modules.

FIGS. 7A to 7D illustrate the application of a FPGA programming method according to an embodiment of the invention for implementing a simple combinatorial logic circuit, namely a two-bit adder with carry. The truth table of such a circuit is given in table 8:

TABLE 8

| $x_1$ | $x_2$ | $y_1$ | $y_2$ | $z_1$ | $z_2$ | r |
|---|---|---|---|---|---|---|
| 0 | 0 | 0 | 0 | 0 | 0 | 0 |
| 0 | 0 | 0 | 1 | 0 | 1 | 0 |
| 0 | 0 | 1 | 0 | 1 | 0 | 0 |
| 0 | 0 | 1 | 1 | 1 | 1 | 0 |
| 0 | 1 | 0 | 0 | 0 | 1 | 0 |
| 0 | 1 | 0 | 1 | 1 | 0 | 0 |
| 0 | 1 | 1 | 0 | 1 | 1 | 0 |
| 0 | 1 | 1 | 1 | 0 | 0 | 1 |
| 1 | 0 | 0 | 0 | 1 | 0 | 0 |
| 1 | 0 | 0 | 1 | 1 | 1 | 0 |
| 1 | 0 | 1 | 0 | 0 | 0 | 1 |
| 1 | 0 | 1 | 1 | 0 | 1 | 1 |
| 1 | 1 | 0 | 0 | 1 | 1 | 0 |
| 1 | 1 | 0 | 1 | 0 | 0 | 1 |
| 1 | 1 | 1 | 0 | 0 | 1 | 1 |
| 1 | 1 | 1 | 1 | 1 | 0 | 1 | where $(x_1, x_2)$ and $(y_1, y_2)$ are the two two-bit addenda, $(z_1, z_2)$ is the two-bit result and r (1 bit) is the carry: $(x_1, x_2)+(y_1, y_2)=(z_1, z_2)$ with carry (r).

Figure 7A:
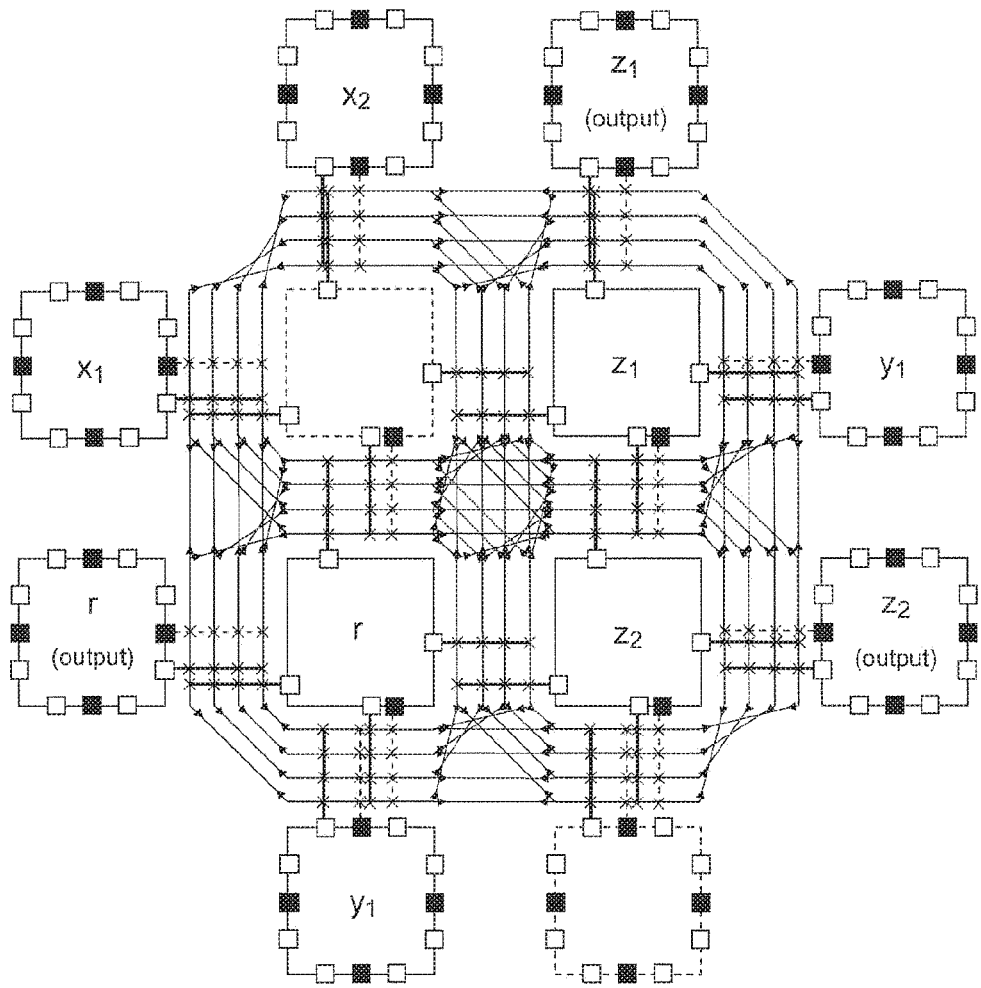
FIGS. 7A, 7B, 7C and 7D illustrate the application of a FPGA programming method according to an embodiment of the invention for implementing a simple logic circuit.

The adder is described, placed and routed using the VPR (Versatile Place and Route) academic software on a FPGA architecture of the kind illustrated on FIGS. 1A, 1B with: W=4, k=4, L=5. The number of bits required to configure each logic bloc is $2^k+1=17$. FIG. 7A shows the routing network of the architecture with the adder placed, as generated by the place-and-route tool.

Three logic blocks, arranged on a 2×2 array with one unused block, are required to compute the three output bits—$z_1$, $z_2$ and r. The place-and-route tools considers input/output blocks spread on the outer ring of the FPGA, while in the present application input and output must be spread on the logic fabric. Therefore, additional macrocells have to be introduced to account for the routing channels at the leftmost and bottommost sides of the design. Indeed, since the macrocell only contains the logic elements and its surrounding local routing network, the leftmost and bottommost channels are left orphan and must be included in a dedicated macrocell, even if they don't include a logic element.

Figure 7B:
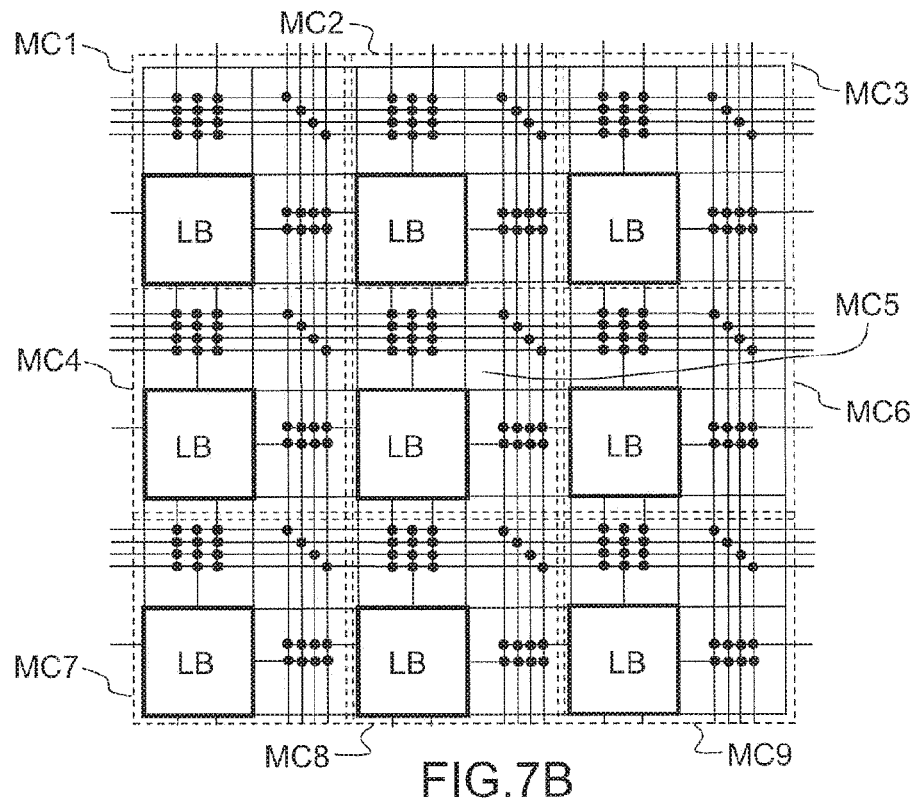

FIG. 7B shows the equivalent reconfigurable fabric needed to place the adder. For the reasons discussed above, a 3×3 array of macrocells MC1-MC9 is used. Only the logic blocks of macrocells MC3, MC5 and MC6 are used for computation; the other ones are unused.

Figure 7C:
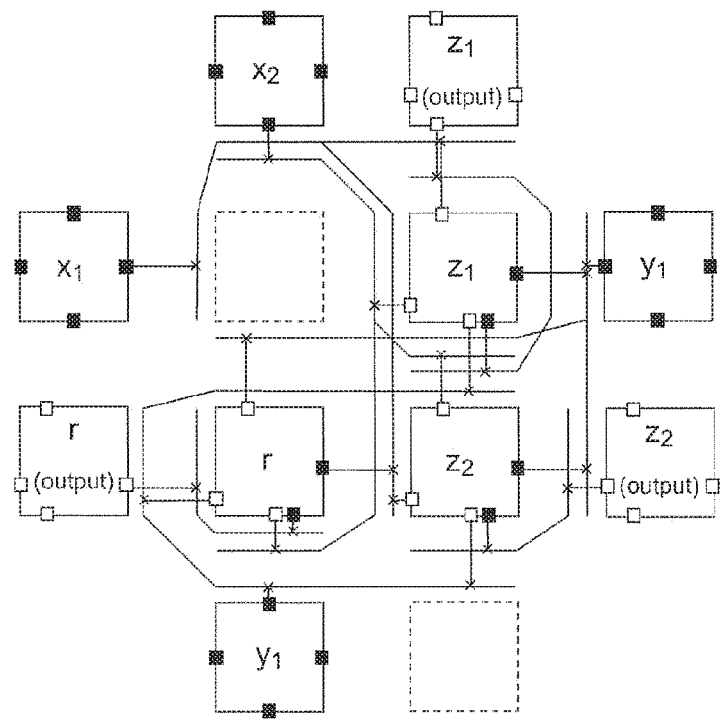

FIG. 7C shows the fully routed design, featuring the necessary routes between the inputs and the logic blocks as well as the outputs routing.

Figure 7D:
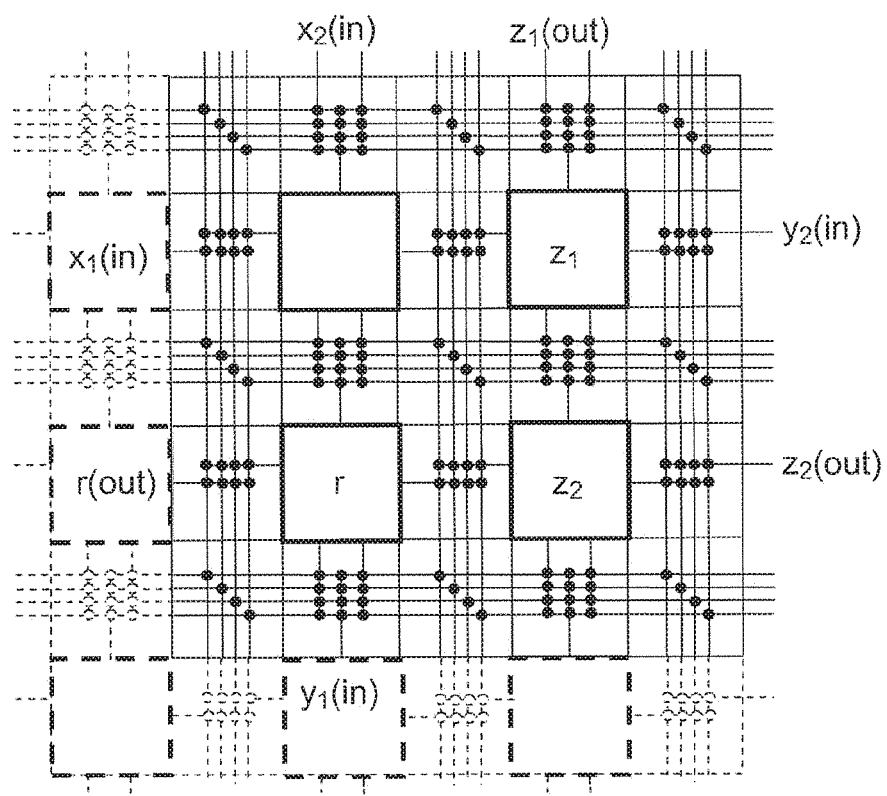

FIG. 7D depicts the same network using the conventions of FIG. 1A. Dotted elements are physically part of the task but are not needed.

The data contained in a virtual bitstream defining the logic fabric configuration are the following:
Width: 3
Height: 3
Macro count: 9
  Macro 1, at (0,0)
    Connection from 20 to 8
  Macro 2, at (1,0)
    Connection from 3 to 12
    Connection from 3 to 8
    Connection from 19 to 11
    Connection from 19 to 13
  Macro 3, at (2;0)
    Connection from 3 to 16
    Connection from 14 to 19
    Connection from 20 to 12
  Macro 4, at (0;1)
    Connection from 15 to 17
    Connection from 15 to 11
    Connection from 12 to 20
  Macro 5, at (1,1)
    Connection from 16 to 8
    Connection from 6 to 9
    Connection from 6 to 13
    Connection from 7 to 20
    Connection from 7 to 17
  Macro 6, at (2;1)
    Connection from 0 to 18
    Connection from 2 to 16
    Connection from 7 to 3
    Connection from 7 to 17
    Connection from 5 to 19
    Connection from 13 to 20
  Macro 7, at (0;2)
    Connection from 4 to 11
  Macro 8, at (1;2)
    Connection from 19 to 3
    Connection from 6 to 18
    Connection from 16 to 0
  Macro 9, at (2;2)
    Connection from 0 to 19
    Connection from 18 to 6
plus the 3×17 bits required to configure the logic blocks of macrocells MC3 (16 bits defining the truth table for $z_1$ plus a "SEL" bit for choosing the combinatorial output of the logic block), MC5 (16 bits defining the truth table for r plus a "SEL" bit for choosing the combinatorial output of the logic block) and MC6 (16 bits defining the truth table for $z_2$ plus a "SEL" bit for choosing the combinatorial output of the logic block).

Table 9 presents the full representation of the virtual bitstream using the first format described above (see Table 5):

TABLE 9

| Size (bits) | Field | | | Value |
|---|---|---|---|---|
| 2 | SizeX | | | 3 |
|   | SizeY | | | 3 |
| 4 |   | | | 9 |
| 2 |   | PosX | | 0 |
|   |   | PosY | | 0 |
| 17 |   | Logic data | | X |
| 4 |   | RouteCount | | 1 |
| 5 |   | List of connections | In | 8 |
|   |   |   | Out | 20 |
| 2 | List of | PosX | | 1 |
|   | macros | PosY | | 0 |
| 17 |   | Logic data | | X |
| 4 |   | RouteCount | | 4 |
| 5 |   | List of connections | In | 8 |
|   |   |   | Out | 3 |
|   |   |   | In | 11 |
|   |   |   | Out | 19 |
|   |   |   | In | 12 |
|   |   |   | Out | 3 |
|   |   |   | In | 13 |
|   |   |   | Out | 19 |
| 2 | List of | PosX | | |
|   | macros | PosY | | |
| 17 |   | Logic data | | X |
| 4 |   | RouteCount | | 3 |
| 5 |   | List of connections | In | 3 |
|   |   |   | Out | 16 |
|   |   |   | In | 14 |
|   |   |   | Out | 19 |
|   |   |   | In | 12 |
|   |   |   | Out | 20 |
| 2 | List of | PosX | | |
|   | macros | PosY | | |
| 17 |   | Logic data | | X |
| 4 |   | RouteCount | | 3 |
| 5 |   | List of connections | In | 11 |
|   |   |   | Out | 15 |
|   |   |   | In | 12 |
|   |   |   | Out | 20 |
|   |   |   | In | 15 |
|   |   |   | Out | 17 |
| 2 | List of | PosX | | |
|   | macros | PosY | | |
| 17 |   | Logic data | | X |
| 4 |   | RouteCount | | 5 |
| 5 |   | List of connections | In | 6 |
|   |   |   | Out | 13 |
|   |   |   | In | 7 |
|   |   |   | Out | 20 |
|   |   |   | In | 8 |
|   |   |   | Out | 16 |
|   |   |   | In | 9 |
|   |   |   | Out | 6 |
|   |   |   | In | 17 |
|   |   |   | Out | 7 |
| 2 | List of | PosX | | |
|   | macros | PosY | | 1 |
| 17 |   | Logic data | | X |
| 4 |   | RouteCount | | 6 |
| 5 |   | List of connections | In | 0 |
|   |   |   | Out | 18 |
|   |   |   | In | 2 |
|   |   |   | Out | 16 |
|   |   |   | In | 3 |
|   |   |   | Out | 7 |

TABLE 9-continued

| Size (bits) | Field | | | Value |
|---|---|---|---|---|
|   |   |   | In | 5 |
|   |   |   | Out | 19 |
|   |   |   | In | 7 |
|   |   |   | Out | 17 |
|   |   |   | In | 13 |
|   |   |   | Out | 20 |
| 2 | List of | PosX | | 0 |
|   | macros | PosY | | 2 |
| 17 |   | Logic data | | X |
| 4 |   | RouteCount | | 1 |
| 5 |   | List of connections | In | 4 |
|   |   |   | Out | 11 |
| 2 | List of | PosX | | 1 |
|   | macros | PosY | | 2 |
| 17 |   | Logic data | | X |
| 4 |   | RouteCount | | 3 |
| 5 |   | List of connections | In | 0 |
|   |   |   | Out | 16 |
|   |   |   | In | 18 |
|   |   |   | Out | 6 |
|   |   |   | In | 19 |
|   |   |   | Out | 3 |
| 2 | List of | PosX | | 2 |
|   | macros | PosY | | 2 |
| 17 |   | Logic data | | X |
| 4 |   | RouteCount | | 2 |
| 5 |   | List of connections | In | 18 |
|   |   |   | Out | 6 |
|   |   |   | In | 19 |
|   |   |   | Out | 0 |

Table 10 presents the full representation of the virtual bitstream using the second format described above (see Table 6):

TABLE 10

| Size (bits) | Field | | CP | Value |
|---|---|---|---|---|
| 2 | SizeX | | | 3 |
|   | SizeY | | | 3 |
| 4 | MacroCount | | | 9 |
| 2 | List of | PosX | | 0 |
|   | macros | PosY | | 0 |
| 17 | Logic data | | | X |
| 4 | RouteCount | | | 2 |
| 1 + 5 | List of connections | | CP/CD | 0 | 8 |
|   |   |   | CP/CD | 1 | 20 |
| 2 | List of | PosX | | 1 |
|   | macros | PosY | | 0 |
| 17 | Logic data | | | X |
| 4 | RouteCount | | | 6 |
| 1 + 5 | List of connections | | CP/CD | 0 | 8 |
|   |   |   | CP/CD | 1 | 3 |
|   |   |   | CP/CD | 0 | 11 |
|   |   |   | CP/CD | 1 | 19 |
|   |   |   | CP/CD | 1 | 3 |
|   |   |   | CP/CD | 1 | 19 |
| 2 | List of | PosX | | 2 |
|   | macros | PosY | | 0 |
| 17 | Logic data | | | X |
| 4 | RouteCount | | | 6 |
| 1 + 5 | List of connections | | CP/CD | 0 | 3 |
|   |   |   | CP/CD | 1 | 16 |
|   |   |   | CP/CD | 0 | 14 |
|   |   |   | CP/CD | 1 | 19 |
|   |   |   | CP/CD | 0 | 12 |
|   |   |   | CP/CD | 1 | 20 |
| 2 | List of | PosX | | 0 |
|   | macros | PosY | | 1 |
| 17 | Logic data | | | X |
| 4 | RouteCount | | | 5 |

TABLE 10-continued

| Size (bits) | Field | | CP | Value |
|---|---|---|---|---|
| 1 + 5 | List of connections | CP/CD | 0 | 11 |
| | | CP/CD | 1 | 15 |
| | | CP/CD | 1 | 20 |
| | | CP/CD | 0 | 15 |
| | | CP/CD | 1 | 17 |
| 2 | List of macros | PosX | | 1 |
| | | PosY | | 1 |
| 17 | | Logic data | | X |
| 4 | | RouteCount | | 7 |
| 1 + 5 | List of connections | CP/CD | 0 | 6 |
| | | CP/CD | 1 | 13 |
| | | CP/CD | 1 | 20 |
| | | CP/CD | 1 | 16 |
| | | CP/CD | 1 | 6 |
| | | CP/CD | 0 | 17 |
| | | CP/CD | 1 | 7 |
| 2 | List of macros | PosX | | 2 |
| | | PosY | | 1 |
| 17 | | Logic data | | X |
| 4 | | RouteCount | | 10 |
| 1 + 5 | List of connections | CP/CD | 1 | 18 |
| | | CP/CD | 0 | 2 |
| | | CP/CD | 1 | 16 |
| | | CP/CD | 1 | 7 |
| | | CP/CD | 0 | 5 |
| | | CP/CD | 1 | 19 |
| | | CP/CD | 0 | 7 |
| | | CP/CD | 1 | 17 |
| | | CP/CD | 0 | 13 |
| | | CP/CD | 0 | 20 |
| 2 | List of macros | PosX | | 0 |
| | | PosY | | 2 |
| 17 | | Logic data | | X |
| 4 | | RouteCount | | 2 |
| 1 + 5 | List of connections | CP/CD | 0 | 4 |
| | | CP/CD | 1 | 11 |
| 2 | List of macros | PosX | | 1 |
| | | PosY | | 2 |
| 17 | | Logic data | | X |
| 4 | | RouteCount | | 4 |
| 1 + 5 | List of connections | CP/CD | 1 | 16 |
| | | CP/CD | 0 | 18 |
| | | CP/CD | 1 | 6 |
| | | CP/CD | 1 | 3 |
| 2 | List of macros | PosX | | 2 |
| | | PosY | | 2 |
| 17 | | Logic data | | X |
| 4 | | RouteCount | | 3 |
| 1 + 5 | List of connections | CP/CD | 0 | 18 |
| | | CP/CD | 1 | 6 |
| | | CP/CD | 1 | 0 |

Table 11 presents the full representation of the virtual bitstream using the second format described above (see Table 7):

TABLE 11

| Size (bits) | Field | | | CP | Value |
|---|---|---|---|---|---|
| 2 | SizeX | | | | 3 |
| | SizeY | | | | 3 |
| 4 | MacroCount | | | | 9 |
| 1 | Y list | X-list present? | | | 1 |
| 1 | | Macro present? | | | 1 |
| 17 | | Logic data | | | X |
| 4 | | RouteCount | | | 2 |
| 1 + 5 | | List of connections | CP/CD | 0 | 8 |
| | | | CP/CD | 1 | 20 |
| 1 | | Macro present? | | | 1 |
| 17 | | Logic data | | | X |
| 4 | | RouteCount | | | 6 |

TABLE 11-continued

| Size (bits) | Field | | | CP | Value |
|---|---|---|---|---|---|
| 1 + 5 | | List of connections | CP/CD | 0 | 8 |
| | | | CP/CD | 1 | 3 |
| | | | CP/CD | 0 | 11 |
| | | | CP/CD | 1 | 19 |
| | | | CP/CD | 1 | 3 |
| | | | CP/CD | 1 | 19 |
| 1 | | Macro present? | | | 1 |
| 17 | | Logic data | | | X |
| 4 | | RouteCount | | | 6 |
| 1 + 5 | | List of connections | CP/CD | 0 | 3 |
| | | | CP/CD | 1 | 16 |
| | | | CP/CD | 0 | 14 |
| | | | CP/CD | 1 | 19 |
| | | | CP/CD | 0 | 12 |
| | | | CP/CD | 1 | 20 |
| 1 | X-list present? | | | | 1 |
| 1 | X list | Macro present? | | | 1 |
| 17 | | Logic data | | | X |
| 4 | | RouteCount | | | 5 |
| 1 + 5 | | List of connections | CP/CD | 0 | 11 |
| | | | CP/CD | 1 | 15 |
| | | | CP/CD | 1 | 20 |
| | | | CP/CD | 0 | 15 |
| | | | CP/CD | 1 | 17 |
| 1 | | Macro present? | | | 1 |
| 17 | | Logic data | | | X |
| 4 | | RouteCount | | | 7 |
| 1 + 5 | | List of connections | CP/CD | 0 | 6 |
| | | | CP/CD | 1 | 13 |
| | | | CP/CD | 1 | 20 |
| | | | CP/CD | 1 | 16 |
| | | | CP/CD | 1 | 6 |
| | | | CP/CD | 0 | 17 |
| | | | CP/CD | 1 | 7 |
| 1 | | Macro present? | | | 1 |
| 17 | | Logic data | | | X |
| 4 | | RouteCount | | | 10 |
| 1 + 5 | | List of connections | CP/CD | 1 | 18 |
| | | | CP/CD | 0 | 2 |
| | | | CP/CD | 1 | 16 |
| | | | CP/CD | 1 | 7 |
| | | | CP/CD | 0 | 5 |
| | | | CP/CD | 1 | 19 |
| | | | CP/CD | 0 | 7 |
| | | | CP/CD | 1 | 17 |
| | | | CP/CD | 0 | 13 |
| | | | CP/CD | 0 | 20 |
| 1 | X-list present? | | | | 1 |
| 1 | X list | Macro present? | | | 1 |
| 17 | | Logic data | | | X |
| 4 | | RouteCount | | | 2 |
| 1 + 5 | | List of connections | CP/CD | 0 | 4 |
| | | | CP/CD | 1 | 11 |
| 1 | | Macro present? | | | 1 |
| 17 | | Logic data | | | X |
| 4 | | RouteCount | | | 4 |
| 1 + 5 | | List of connections | CP/CD | 1 | 16 |
| | | | CP/CD | 0 | 18 |
| | | | CP/CD | 1 | 6 |
| | | | CP/CD | 1 | 3 |
| 1 | | Macro present? | | | 1 |
| 17 | | Logic data | | | X |
| 4 | | RouteCount | | | 3 |
| 1 + 5 | | List of connections | CP/CD | 0 | 18 |
| | | | CP/CD | 1 | 6 |
| | | | CP/CD | 1 | 0 |

In tables 10 and 11 CP/CD means "Connection present flag/Connection data".

The size of the raw bitstream is 1323 bits that of the virtual bitstream is : 513 bits if the first format is used (38.7% of the raw size), 503 (38%) for the second format and 479 (36.2%) for the third format. The second and third formats are really interesting for dense routing networks, which is not the case here.

REFERENCES

[Kalte2005] Kalte, Heiko, et al. "*Replica: A bitstream manipulation filter for module relocation in partial reconfigurable systems*" Proceedings of the 19th IEEE International Symposium on Parallel and Distributed Processing IEEE, 2005.

[Kalte2006] Kalte, Heiko, and Mario Porrmann. "*REPLICA2Pro: Task relocation by bitstream manipulation in Virtex-II/Pro FPGAs.*" Proceedings of the 3rd conference on Computing frontiers. ACM, 2006.

[Horta2001] Horta, Edson, and John W. Lockwood. "*PARBIT: a tool to transform bitfiles to implement partial reconfiguration of field programmable gate arrays (FPGAs).*" Dept. Comput. Sci., Washington Univ., Saint Louis, Mo., Tech. Rep. WUCS-01-13 (2001).

[Dandalis2001] Dandalis, Andreas, and Viktor K. Prasanna. "*Configuration compression for FPGAbased embedded systems.*" Proceedings of the 2001 ACM/SIGDA ninth international symposium on Field programmable gate arrays. ACM, 2001

[Bazargan 1999] K. Bazargan, R. Kastner and M. Sarrafzadeh "*Fast Template Placement for Reconfigurable Computing Systems.*" DTC, 2000, vol. 17, no. 1, pp. 68-83.

[Steiger 2003] Ch. Steiger, H. Walder and M. Platzner "*Heuristics for Online Scheduling Real-Time Tasks to Partially Reconfigurable Devices.*" FPL, Berlin, Heidelberg, 2003, vol. 2778, no. 56, pp. 575-584.

[Tabero 2003] J. Tabero, J. Septién, H. Mecha, D. Mozos, S. Romàn "*A vertex-list approach to 2D HW multitasking management in RTR FPAGs.*" DCIS, 2003.

[Tabero 2006] J. Tabero, J. Septién, H. Mecha, D. Mozos "*Task Placement Heuristic Based on 3D-Adjacency and Look-Ahead in Reconfigurable Systems.*" ASP-DAC, 2006

[Hu 2010] W. Hu, C. Wang, J. L. Ma, T. Z. Chen, D. Chen "*A Novel Approach for Finding Candidate Locations for Online FPGA Placement.*" CIT, 2010, pp. 2509-2515.

The invention claimed is:

1. A method of programming a FPGA, wherein said FPGA comprises an array of macrocells, each comprising at least a configurable hardware block and a configurable interconnection network, the method comprising the steps of:
   a) providing a high-level configuration file containing:
      first data defining a set of macrocells and their relative positions;
      second data defining a configuration of the hardware blocks of said macrocells; and
      third data defining interconnections between said macrocells;
      wherein said high-level configuration file contains neither data defining an absolute position of said macrocells within the FPGA, nor local routing information fully defining a configuration of their interconnection networks;
   b) converting said high-level configuration file into a bitstream file; and
   c) uploading said bitstream file into the FPGA.

2. The method of claim 1, wherein each said interconnection network comprises a set of ports connected to respective ports of the interconnection networks and hardware blocks of adjacent macrocells, of hardware blocks or block of the same macrocell and/or to input/output blocks of the FPGA, and a set of switches for performing said local routing, and wherein said third data of the high-level configuration file include a description of the connections between the ports of each said interconnection network, but not of the statuses of said switches.

3. The method of claim 1 wherein said step b) comprises:
   b1) using at least said first data of said high-level configuration file for determining the absolute positions of said macrocells within said FPGA;
   b2) using at least said third data of said high-level configuration file for determining the local routing information fully defining a configuration of the interconnection networks of said macrocells; and
   b3) generating said bitstream file, containing information defining said absolute positions, said second data of said high-level configuration file and said local routing information, a format of said bitstream file being dependent on an architecture of said FPGA.

4. The method of claim 1, wherein said high-level configuration file comprises a list of all the macrocells belonging to a rectangular sub-array of said FPGA and, for each said macrocell:
   its relative position within said sub-array;
   data defining a configuration of its hardware block or blocks; and
   a list of pairs of ports of its interconnection network or networks.

5. The method of claim 1, wherein said high-level configuration file comprises a list of all the macrocells belonging to a rectangular sub-array of said FPGA and, for each said macrocell:
   its relative position within said sub-array;
   data defining a configuration of its hardware block or blocks;
   a list of ports of its interconnection network or networks, called input ports and, for each said input port: either a list of ports of the same interconnection network, called output ports, to which said input port is to be connected or, if said input port is not to be connected to any output port, a pointer to a successive output port which is to be connected to at least one output port.

6. The method of claim 1, wherein said high-level configuration file comprises a list of columns of a sub-array of said FPGA; for each said column, either a list of macrocells to be configured belonging to said column and to different rows or, if said column contains no such macrocell, a pointer to a successive column containing at least one such macrocell; for each said macrocell,
   an identifier of the row to which it belongs;
   data defining a configuration of its hardware block or blocks;
   a list of ports of its interconnection network or networks, called input port and, for each said input port: either a list of ports of the same interconnection network, called output ports, to which said input port is to be connected or, if said input port is not to be connected to any output port, a pointer to a successive output port which is to be connected to at least one output port.

7. The method of claim 1 wherein:
   step a) comprises downloading said high-level configuration file from an external memory and uploading it into a local memory;
   step b) comprises downloading said high-level configuration file from said local memory, converting it into said bitstream file, and uploading said bitstream file into said or another local memory; and step c) comprises downloading said bitstream file from said local memory and uploading it at a predetermined location of a configuration memory of said FPGA.

8. The method of claim 1, wherein said step b) comprises the following operations:
- b-i) extracting from said high-level configuration file a list of connections between ports of the interconnection network or networks of each said macrocell;
- b-ii) for each connection of said list, determining a local route of the corresponding interconnection network suitable for implementing said connection; and
- b-iii) checking said local route for conflicts with existing routes;

said operations b-ii) and b-iii) being repeated until a route with no conflict is found or all possible routes have been tested.

9. The method of claim 1, further comprising a preliminary step of verifying that said high-level configuration file is such that said step b) can be carried out successfully for a given FPGA architecture.

10. The method of claim 1 wherein said high-level configuration file is associated to at least one hardware task, to be implemented by said set of macrocells, and wherein said step c) realizes partial reconfiguration of said FPGA.

11. A device for programming a FPGA, wherein said FPGA comprises an array of macrocells, each comprising at least a configurable hardware block and a configurable interconnection network, the device comprising:
- at least one de-virtualizing module, configured for converting a high-level configuration file into a bitstream file whose format depends on the architecture of the FPGA; and
- at least one logic mapping module, configured for uploading a said bitstream file at a predetermined location of a configuration memory of the FPGA;
- wherein said high-level configuration file contains:
  - first data defining a set of macrocells and their relative positions;
  - second data defining a configuration of the hardware blocks of said macrocells; and
  - third data defining interconnections between said macrocells;
- and it contains neither data defining an absolute position of said macrocells within the FPGA, nor local routing information fully defining a configuration of their interconnection networks.

12. The device of claim 11 further comprising:
- at least one fetching module, configured for downloading a said high-level configuration file from an external memory and uploading it into a local memory; wherein
- said or at least one said de-virtualizing module is configured for downloading a said high-level configuration file from said local memory, converting it into a bitstream file whose format depends on the architecture of the FPGA, and uploading said bitstream file into said or another local memory; and
- said or at least one said logic mapping module is configured for downloading a said bitstream file from a said local memory and uploading it at a predetermined location of a configuration memory of the FPGA.

13. The device of claim 11, comprising a plurality of said de-virtualizing modules, the device being configured for: splitting a said high-level configuration files into sections, each containing data relative to a subset of macrocells; providing different sections to different de-virtualizing modules; and merging partial bitstream files generated by said de-virtualizing modules into a unique bitstream file.

14. The device of claim 11 comprising a plurality of processing units, each comprising at least one de-virtualizing module and being configured for operating in parallel to convert respective high-level configuration files into respective bitstream files.

15. A semiconductor chip comprising a FPGA and a device for programming said FPGA, wherein the FPGA comprises an array of macrocells, each comprising at least a configurable hardware block and a configurable interconnection network, and the device comprises:
- at least one de-virtualizing module, configured for converting a high-level configuration file into a bitstream file whose format depends on the architecture of the FPGA; and
- at least one logic mapping module, configured for uploading a said bitstream file at a predetermined location of a configuration memory of the FPGA; wherein said high-level configuration file contains
- first data defining a set of macrocells and their relative positions;
- second data defining a configuration of the hardware blocks of said macrocells; and
- third data defining interconnections between said macrocells;
- and it contains neither data defining an absolute position of said macrocells within the FPGA, nor local routing information fully defining a configuration of their interconnection networks.

* * * * *